(12) United States Patent
Yeh et al.

(10) Patent No.: US 6,366,512 B1
(45) Date of Patent: Apr. 2, 2002

(54) ERROR WRITE PROTECTION CIRCUIT USED IN SEMICONDUCTOR MEMORY DEVICE

(75) Inventors: Clement Yeh; Jea-Hong Lou, both of Hsin-Chu (TW)

(73) Assignee: Global Unichip Corporation, Hsin-chu (TW)

( * ) Notice: Subject to any disclaimer, the term of this patent is extended or adjusted under 35 U.S.C. 154(b) by 0 days.

(21) Appl. No.: 09/726,255

(22) Filed: Nov. 30, 2000

(51) Int. Cl.[7] ............................................... G11C 7/00
(52) U.S. Cl. .................... 365/203; 365/190; 365/230.04
(58) Field of Search ................................. 365/203, 190, 365/227, 230.04

(56) References Cited

U.S. PATENT DOCUMENTS

| | | | |
|---|---|---|---|
| 4,586,166 A | 4/1986 | Shah | 365/154 |
| 4,618,945 A | 10/1986 | Sakurai et al. | 365/189 |
| 4,623,989 A | 11/1986 | Blake | 365/156 |
| 5,757,689 A * | 5/1998 | Seno | 365/72 |
| 5,777,935 A * | 7/1998 | Pantelakis et al. | 365/203 |
| 6,219,272 B1 * | 4/2001 | Konishi | 365/154 |

* cited by examiner

*Primary Examiner*—Son Mai
(74) *Attorney, Agent, or Firm*—George O. Saile; Stephen B. Ackerman

(57) ABSTRACT

In the present invention a bit line precharge circuit is used to prevent errors from a write operation in memory cells adjacent to the column being written. The precharge circuits are enabled by write enable and selected by the Y decoder in such a way that only precharge circuits on bit lines adjacent to the active bit lines in a write operation are activated. All other precharge circuits on bit lines more remote than immediately adjacent bit lines are not activated and thus saving power during a write operation.

13 Claims, 4 Drawing Sheets

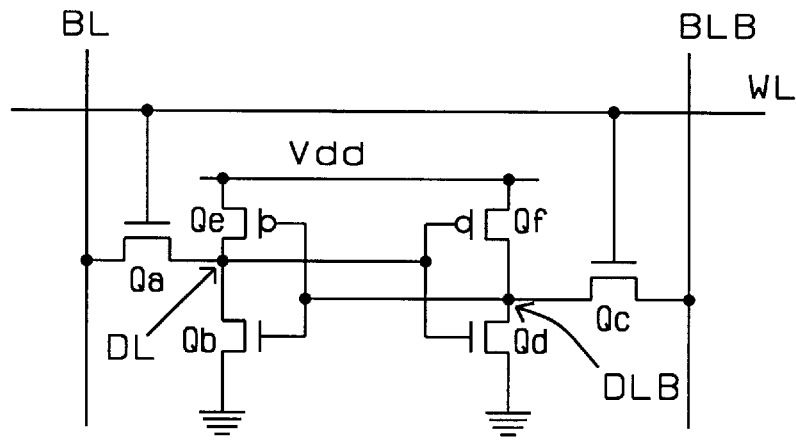
*FIG. 1a - Prior Art*
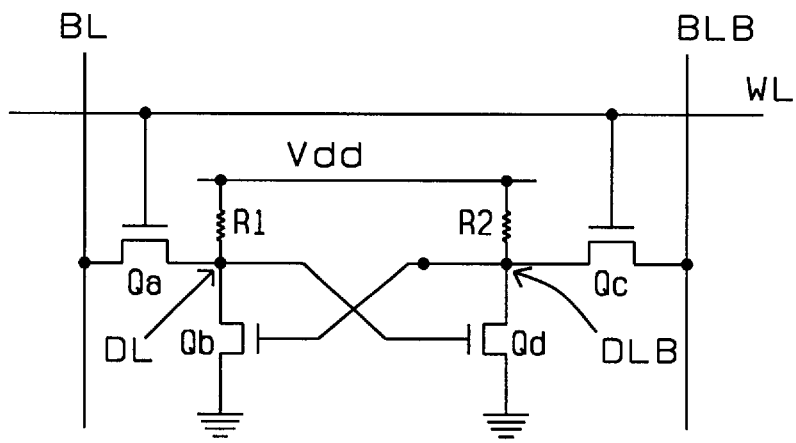
*FIG. 1b - Prior Art*

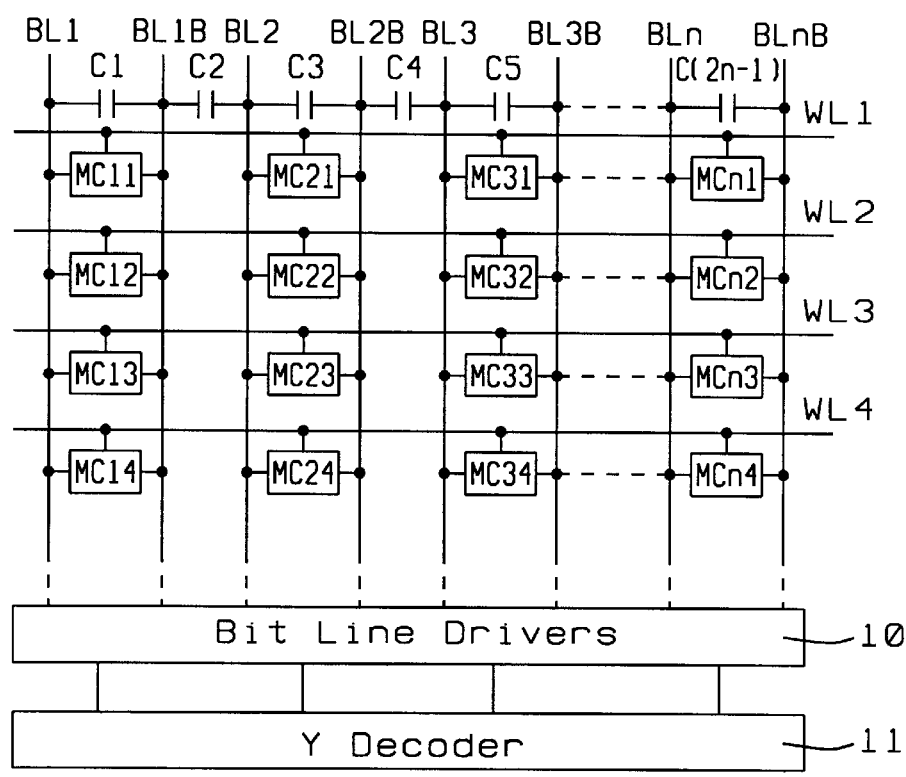
FIG. 2 - Prior Art

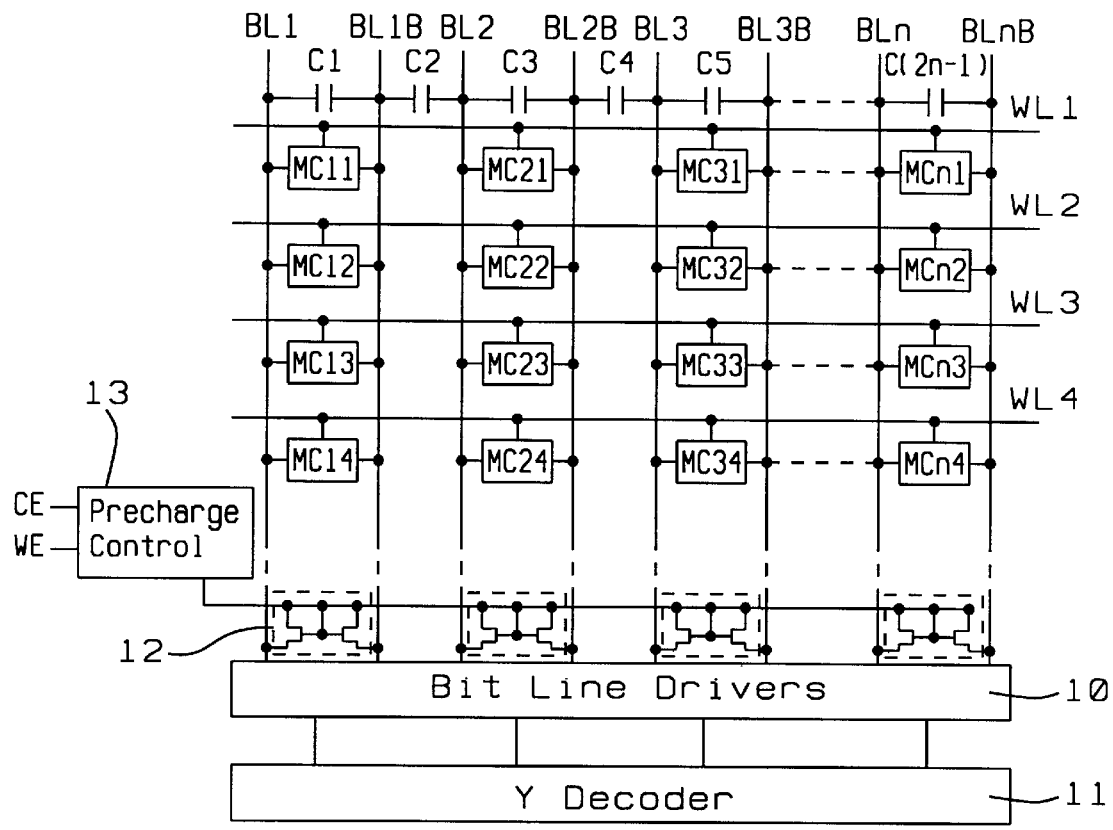
FIG. 3 – Prior Art

ERROR WRITE PROTECTION CIRCUIT USED IN SEMICONDUCTOR MEMORY DEVICE

BACKGROUND OF THE INVENTION

1. Field of Invention

The present invention relates to semiconductor memories and in particular to write error protection.

2. Description of Related Art

As semiconductor product is made from very deep sub micron (VDSM) semiconductor circuitry coupling capacitance between wires has an increasing effect on circuit operations. This is particularly true in semiconductor memories where interconnections, such as bit lines, are often close together and run in parallel for a considerable distance. A data error write can occur, for instance, in an SRAM as a result of coupling capacitance between bit lines, and occurs on memory cells in adjacent columns to the memory column being selected.

In U.S. Pat. No. 4,623,989 (Blake) an SRAM is directed to cells that have P-channel access and driver transistors. Bit lines in the SWAM are precharged to a voltage close to Vss and wordlines are held near Vcc in the off state in order to have good immunity to read and alpha particle induced errors. In U.S. Pat. No. 4,618,945 (Sukurai et al.) is directed to a memory device with an array of memory cells. Rows of memory cells are connected by wordlines which include a first and second wordline. In response to a column address signal a switch in each row is turned on that connects a first wordline to a second wordline. In U.S. Pat. No. 4,586,166 (Shah) is directed to an SRAM where positive feedback is used with bit line loads during read and write operations, avoids read after read errors, and having a short write time.

In FIG. 1a is shown a six transistor memory cell where transistors Qb, Qd, Qe and Qf are cross coupled to produce a bistable circuit with stored voltage at DL and DLB. Transistors Qa and Qc controlled by a wordline WL connect the stored voltage at DL to bit line BL and stored voltage at DLB to bit line BLB. In FIG. 1b is shown a four transistor memory cell. Transistors Qb and Qc are cross coupled to produce a bistable circuit with stored voltages at DL, and DLB. Resistors R1 and R2 connect Vdd to transistors Qb and Qd respectively. Transistors Qa and Qc controlled by a wordline WL connect the stored voltage at DL to bit line BL and stored voltage at DLB to bit line BLB.

In FIG. 2 is shown a portion of an SRAM memory array of prior art. Memory cells represented by MC22 are connected in columns to bit lines represented by bit lines BL2 and BL2B, where BL2B is the logical compliment of BL2. Adjacent to the column containing memory cell MC22 is a column to the left containing a memory cell MC11 and a column to the right containing memory cell MC31. Each bit line is connected to bit line drivers 10 which are used to read and write the data contained within each cell under the control of the Y decoder 11. A first wordline WL1 connects to one cell in each column MC11, MC21, MC31 and MCn1. A second wordline WL2 connects to the row of memory cells containing MC12, MC22, MC32 and MCn2, and a third wordline WL3 connects to a row on memory cells containing MC13, MC23, MC33 and MCn3. Each row of memory cell is connected to a wordline similar to wordline WL4 connected to a row of memory cells containing memory cell MC24.

Continuing to refer to FIG. 2, since the memory array is organized into rows and columns, the bit lines of adjacent columns are routed in parallel with each other. This results in coupling capacitance such as C1 between BL1 and BL1B, C2 between BL1B and BL2, C3 between BL2 and BL2B, C4 between BL2B and BL3, C5 between BL3 and BL3B and so on. As semiconductor devices are made smaller, the columns become closer together and the coupling capacitance becomes larger allowing more energy to be coupled between bit lines to a point where a write disturb condition results at memory cells in adjacent columns to the memory column where a write operation is being performed.

Continuing to refer to FIG. 2 along with FIGS. 1a and 1b, if memory cell MC22 is to be written, wordline WL2=1, all other word lines are held at ground potential, and the Y decoder 11 activates the bit line drivers for the column to which data is to be written. Assuming that the initial logic states DL of MC12, MC22, MC31 and MC33 are high and logic states at DLB of MC12, MC22, MC31 and MC33 are low; logic states at DL of MC11, MC13 and MC32 are low and logic states at DLB of MC11, MC13 and MC32 are high. If the previous data written into MC22 is BL2=high and BL2B=low, then in the next cycle when the new data makes BL2=low and BL2B=high a voltage change takes place on bit line BL2 that is coupled into bit line BL1B, and similarly a voltage change takes place on bit line 13L2B that is coupled into bit line BL3. If a memory cell such as MC11 and MC13 that are not connected to WL2 has data stored and BL1 is in a low state (ground), then a negative voltage coupled into bit line BL1B can be sufficient to turn on transistor Qc (shown in FIGS. 1a and 1b) overwrite the data in cells MC11 or MC13, and destroy the stored data. In like manner, again in the next cycle, when the new data makes BL2=high and BL2B=low, a voltage change takes place on bit line BL2B that is coupled into bit line BL3, and similarly a voltage change takes place on bit line BL2 that is coupled into bit line BL1B. If a memory cell such as MC31 and MC33 that are not connected to WL2 has data stored and BL3 is in a low state (ground), then a negative voltage coupled into bit line BL3 can be sufficient to turn on Qc (show in FIGS. 1a and 1b) to overwrite the data in cells MC31 or MC33, and destroy the stored.

In FIG. 3 is shown a diagram of prior art of an SRAM with bit line precharge circuitry used to improve error protection during write operation. Precharge circuits 12 are connected to each bit line BL1, B12, BL3, and BLn, and bit line bar B11B, BL2B, BL3B and BLnB. The precharge circuits 12 are controlled from a precharge control circuit 13. The precharge circuits 12 precharge the bit lines to a voltage less than VDD by an amount approximately equal to a transistor threshold. The precharge control 13 is activated using chip enable CE and write enable WE. Each time a write operation is done all bit lines in FIG. 3 are precharged to prevent voltage coupled from adjacent bit lines from destroying data in memory cells not being written. The disadvantage with this approach is that there is a considerable amount of power dissipated to provide precharging to every bit line during a write operation to a cell in a column when only bit lines adjacent to those involved in the write operation are at risk for coupling a charge that can destroy data in a memory cell no being written.

SUMMARY OF THE INVENTION

An objective of the present invention is to prevent disturb conditions resulting from a write operation from destroying data stored in a memory cell not being written. It is further an objective of the present invention to precharge only bit lines adjacent to the memory column being written to minimize power requirements. It is also an object of the present invention to be able to select and activate precharge circuits using write enable and the Y decoder output.

In the present invention precharge circuits are connected to each bit line in a memory array. The precharge circuits connected to bit lines adjacent to a column being written are selected by a Y decoder selection of bit lines involved in a write operation and activated by a write enable pulse. Bit lines that are not immediately adjacent to the bit lines involved in a write operation are not precharged. Thus for any column "m" involved in a write operation only bit lines on either side of column "m" such as bit line bar BL(m−1)B adjacent to bit line BLm, and bit line BL(m+1) adjacent to bit line bar BLmB are precharged. The bit lines are precharged to a voltage less than or equal to VDD-Vt controlled by the output voltage of a precharge control circuit depending on the strength of bit line coupling effect, where Vt is a transistor threshold voltage. Bit lines BL(m−1), BL(m+1)B and those further away from the column being written are not precharged and in turn saving power during a write operation. The memory cells in the memory array can be either a four transistor memory cell similar to than shown in FIG. 1b, or a six transistor memory cell similar to that shown in FIG. 1a.

BRIEF DESCRIPTION OF THE DRAWINGS

This invention will be described with reference to the accompanying drawings, wherein:

FIGS. 1a and 1b are schematic diagrams of a six transistor memory cell and a four transistor memory cell, FIG. 2 is a schematic diagram of a memory array of prior art without bit line precharge circuitry, FIG. 3 is a schematic diagram of a memory array of prior art with bit line precharge circuitry active on all bit lines.

DETAILED DESCRIPTION OF THE PREFERRED EMBODIMENT

Figure 4:
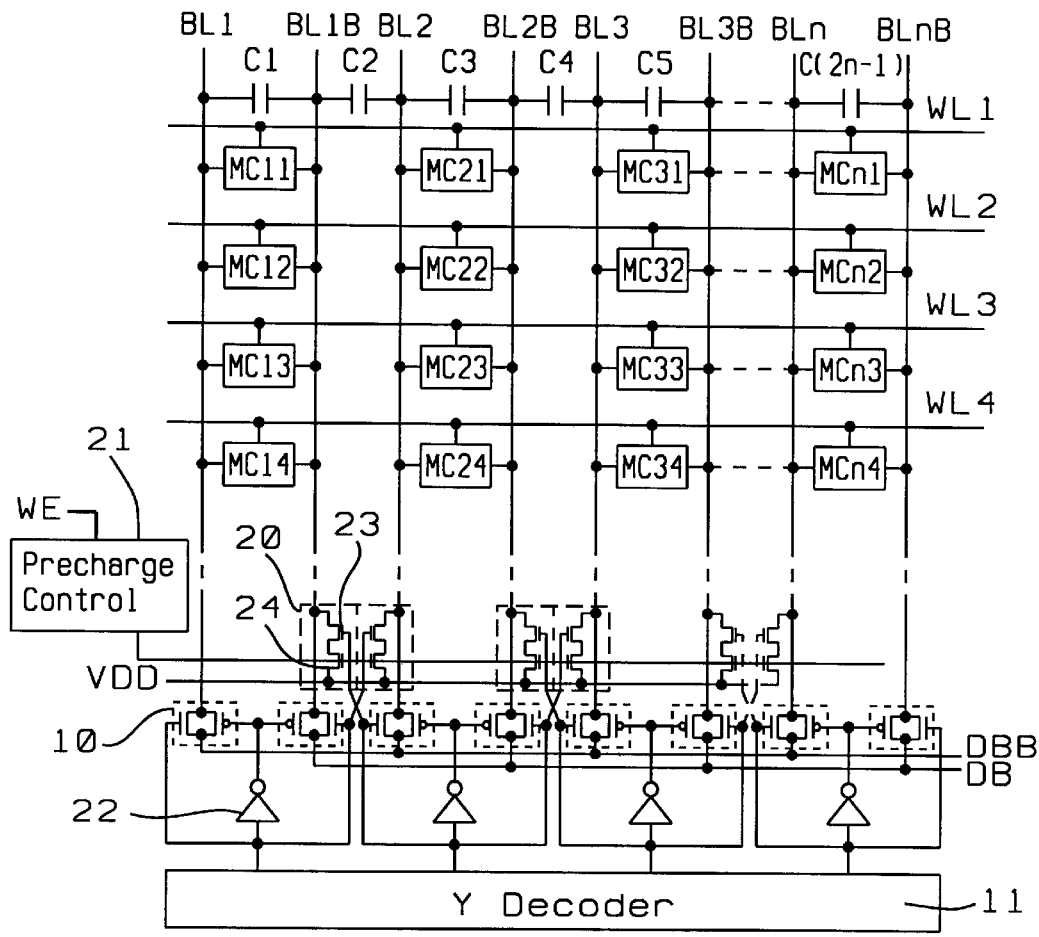
FIG. 4 is a schematic diagram of the preferred embodiment of the present invention with precharge circuitry selected for immediately adjacent bit lines.

The preferred embodiment of the present invention is shown in FIG. 4 in which a memory array organized in rows and columns is protected from write errors by precharge circuits connected to bit lines. Each column of memory cells is connected by a bit line (BL1, BL2, BL3, BLn) and a bit line bar (BL1B, BL2B, BL31B, BLnB). Each row of memory cells is connected by word lines (WL1, WL2, WL3, WL4,) Each bit line and bit line bar are connected to a bit line buffer amplifier 10 that is controlled by a Y decoder 11. The buffer amplifiers 10 connect data DB and data bar DBB to and from the bit lines. Coupling capacitance between adjacent bit lines (such as C1 between BL1 and BL1B, C2 between BL1B and BL2, C3 between BL2 and BL2B, C4 between BL2B and BL3, C5 between BL3 and BL3B and C(2n−1) between BLn and BLnB) provide a mechanism to cause an error during a write operation in a memory cell located in a column not being written into.

A precharge circuit 20 comprising of two transistors 23 24 is connected in series between VDD and a bit line. Each precharge circuit is enabled by a precharge control circuit 21 which is controlled by a write enable signal WE. The lower transistor 24 of the two transistor precharge circuit 20 connects VDD to the upper transistor 23 under the control of the precharge control circuit 21. The precharge control circuit 21 applies a voltage less than VDD to the gate of the lower transistor 24 when write enable WE=1. This enables the precharge circuits during a write operation. The Y decoder 11 selects a column with a logical "1". The logical "1" is connected to the gate of the N-channel transistor of the transmission gate 10 and the logical "1" is inverted to connect to the gate of the P-channel transistor of the transmission gate 10. The Y decoder 11 also connects the logical "1" to the gate of the upper transistor 23 of the two transistor precharge circuit 20 which selects the precharge circuit to be connected to the adjacent bit line.

Continuing to refer to FIG. 4, when the Y decoder 11 selects a column such as the column with bit lines BL2 and BL2B, a logical "1" is applied to the gates of the N-channel transistors of the buffer amplifiers 10 connected to the bit lines, and a logical "0" is applied through inverter 22 to the gates of the P-channel transistors of the buffer amplifiers 10 connected to the bit lines. The logical "1" is also applied to the precharge circuits 20 connected to bit line BL1B and bit line BL3. Bit line BL1B is in parallel and in close proximity to bit line BL2 of the activated column to which a write operation is to be applied. Similarly, BL3 is in parallel and in close proximity to bit line BL2B. When the bit line precharge circuits are activated by selection from the Y decoder 11 and enabled by the precharge control circuit 21, bit lines BL1B and BL3 are precharged to a voltage less than VDD. The adjacent bit lines, BL1B and BL3 for example, when precharged provide a "voltage buffer" to a coupled signal from a write operation in the column containing bit line BL2 and BL2B. The rest of the precharge circuits are not selected and the voltage of the bit lines to which they are attached are not controlled to a high state by a precharge circuit during a write operation on the column with bit lines BL2 and BL2B.

While the invention has been particularly shown and described with reference to preferred embodiments thereof, it will be understood by those skilled in the art that various changes in from and details may be made without departing from the spirit and scope of the invention.

What is claimed is:

1. A write error protection circuit, comprising:
   a semiconductor memory,
   a first bit line in a first column of memory cells and a second bit line in a second column of memory cells in routed adjacency,
   a first precharge circuit connected to said first bit line and selected to precharge said first bit line by a signal selecting said second bit line and activated when said second bit line is write enabled,
   a second precharge circuit connected to said second bit line and selected to precharge said second bit line by a signal selecting said first bit line and activated when said first bit line is write enabled.

2. The circuit of claim 1, wherein each bit line of said semiconductor memory is connected to a precharge circuit that is activated when a bit in an adjacent column is selected and a write operation is enabled.

3. The circuit of claim 1, wherein a selected column of memory cells comprising a bit line and a bit line bar activates said precharge circuits connected to adjacent bit lines located in two adjacent columns on either side of said selected column.

4. The circuit of claim 1, wherein said first precharge circuit precharges said first bit line to a voltage less than chip bias Vdd when said second bit line is selected and write is enabled, and said second precharge circuit precharges said second bit line to a voltage less than chip bias Vdd when said first bit line is selected and write is enabled.

5. The circuit of claim 1, wherein said precharge circuit is only active on bit lines adjacent to a column of memory cells selected and write enabled.

6. A write error protection means, comprising:
   a circuit means for precharging bit lines of a semiconductor memory,
   a selecting means for choosing bit lines to be precharged,
   said selecting means choosing a first bit line which is adjacent to a second bit line when said second bit line is activated for a write operation,
   an activating means for precharging said first bit line during said write operation.

7. The write error protection means of claim 6, wherein a Y decoder selects circuitry to precharge bit lines adjacent to column containing memory cell being written.

8. The write error protection means of claim 6, wherein write enable activates precharging circuitry to precharge bit lines adjacent to column containing memory cell being written.

9. The write error protection means of claim 6, wherein said circuit means for precharging said bit lines connects a voltage less than chip bias Vdd to bit lines to be precharged.

10. A method for precharging bit lines in columns adjacent to a column being written to provide error protection during write operation, comprising:
   a) selecting memory column containing memory cell to be written,
   b) selecting precharging circuitry connected to bit lines in columns immediately adjacent to said memory column containing memory cell being written,
   c) enabling said precharging circuitry during a write operation,
   d) applying a predetermined voltage to bit lines to be precharged.

11. The method of claim 10, wherein applying said predetermined voltage is done with a voltage less than chip bias Vdd.

12. The method of claim 10 wherein enabling precharging circuitry is done with write enable signal.

13. The method of claim 10, wherein selecting precharging circuitry connected to bit lines to be precharged is done with an output from a Y decoder.

* * * * *